(12) United States Patent
Tagami et al.

(10) Patent No.: US 10,147,632 B2
(45) Date of Patent: Dec. 4, 2018

(54) WAFER PROCESSING LAMINATE, TEMPORARY ADHESIVE MATERIAL FOR WAFER PROCESSING, AND METHOD FOR MANUFACTURING THIN WAFER

(71) Applicant: SHIN-ETSU CHEMICAL CO., LTD., Tokyo (JP)

(72) Inventors: Shohei Tagami, Annaka (JP); Michihiro Sugo, Takasaki (JP); Hiroyuki Yasuda, Tomioka (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 51 days.

(21) Appl. No.: 15/283,904

(22) Filed: Oct. 3, 2016

(65) Prior Publication Data

US 2017/0110360 A1    Apr. 20, 2017

(30) Foreign Application Priority Data

Oct. 19, 2015    (JP) .................................. 2015-205913

(51) Int. Cl.
*H01L 21/683*       (2006.01)
*B32B 7/06*         (2006.01)
(Continued)

(52) U.S. Cl.
CPC ............ *H01L 21/6836* (2013.01); *B32B 7/06* (2013.01); *B32B 7/12* (2013.01); *B32B 27/283* (2013.01);
(Continued)

(58) Field of Classification Search
CPC .......... H01L 21/683; H01L 21/6835–21/6838; C08G 77/12; C08G 77/14; C08G 77/04;
(Continued)

(56) References Cited

U.S. PATENT DOCUMENTS 7,541,264 B2    6/2009  Gardner et al.
9,365,681 B2 *  6/2016  Kato ...................... C08G 77/52
(Continued)

FOREIGN PATENT DOCUMENTS

EP    3 000 596 A1     3/2016
JP    2004-064040 A    2/2004
(Continued)

OTHER PUBLICATIONS

Mar. 13, 2017 extended Search Report issued in European Patent Application No. 16002215.8.
(Continued)

*Primary Examiner* — Scott R. Walshon
(74) *Attorney, Agent, or Firm* — Oliff PLC

(57) ABSTRACT

A wafer processing laminate including support, temporary adhesive material layer formed on support, and wafer stacked on temporary adhesive material layer, wafer having front surface on which circuit is formed and back surface to be processed, wherein temporary adhesive material layer includes a three-layered complex temporary adhesive material layer that includes first temporary adhesive layer composed of thermoplastic organopolysiloxane polymer layer (A) having thickness of less than 100 nm and releasably laminated to front surface of wafer, second temporary adhesive layer composed of thermosetting siloxane-modified polymer layer (B) releasably laminated to first temporary adhesive layer, and third temporary adhesive layer composed of thermoplastic organopolysiloxane polymer layer (A') having thickness of less than 100 nm, releasably laminated to second temporary adhesive layer, and releasably laminated to support. This wafer processing laminate can withstand thermal process at high temperature exceeding 300° C., and can increase productivity of thin wafers.

19 Claims, 1 Drawing Sheet

(51) Int. Cl.
   *B32B 7/12*      (2006.01)
   *B32B 27/28*     (2006.01)
   *C08G 77/04*     (2006.01)
   *C08G 77/06*     (2006.01)
   *C09J 5/06*      (2006.01)
   *C09J 183/04*    (2006.01)
   *H01L 21/304*    (2006.01)
   *H01L 23/00*     (2006.01)
   *C09J 7/35*      (2018.01)
   *C09J 7/22*      (2018.01)

(52) U.S. Cl.
   CPC ............. *C08G 77/04* (2013.01); *C08G 77/06* (2013.01); *C09J 5/06* (2013.01); *C09J 7/22* (2018.01); *C09J 7/35* (2018.01); *C09J 183/04* (2013.01); *H01L 21/304* (2013.01); *H01L 21/6835* (2013.01); *H01L 24/14* (2013.01); *C09J 2201/36* (2013.01); *C09J 2203/326* (2013.01); *C09J 2205/302* (2013.01); *H01L 2221/6834* (2013.01); *H01L 2221/68327* (2013.01); *H01L 2221/68381* (2013.01); *H01L 2221/68386* (2013.01); *H01L 2224/13147* (2013.01); *H01L 2924/01029* (2013.01)

(58) Field of Classification Search
   CPC ....... C08G 77/52; C08L 83/14; C09D 183/14; C09J 183/14; C09J 2483/00
   See application file for complete search history.

(56) References Cited

U.S. PATENT DOCUMENTS

| | | | |
|---|---|---|---|
| 9,472,438 B2 * | 10/2016 | Kondo | ................ H01L 21/6835 |
| 2005/0233547 A1 | 10/2005 | Noda et al. | |
| 2011/0298021 A1 | 12/2011 | Tada et al. | |
| 2013/0029145 A1 | 1/2013 | Kato et al. | |
| 2013/0108866 A1 | 5/2013 | Kato et al. | |
| 2013/0280886 A1 | 10/2013 | Kato et al. | |
| 2013/0302983 A1 | 11/2013 | Tanabe et al. | |
| 2014/0106137 A1 * | 4/2014 | Kondo | ................ H01L 21/6835 |
| | | | 428/195.1 |

FOREIGN PATENT DOCUMENTS

| | | |
|---|---|---|
| JP | 2006-328104 A | 12/2006 |
| JP | 2013-048215 A | 3/2013 |
| JP | 2013-110391 A | 6/2013 |
| JP | 2013-235939 A | 11/2013 |
| WO | 2010/098151 A1 | 9/2010 |

OTHER PUBLICATIONS

Aug. 28, 2018 Office Action issued in Japanese Application No. 2015-205913.

* cited by examiner

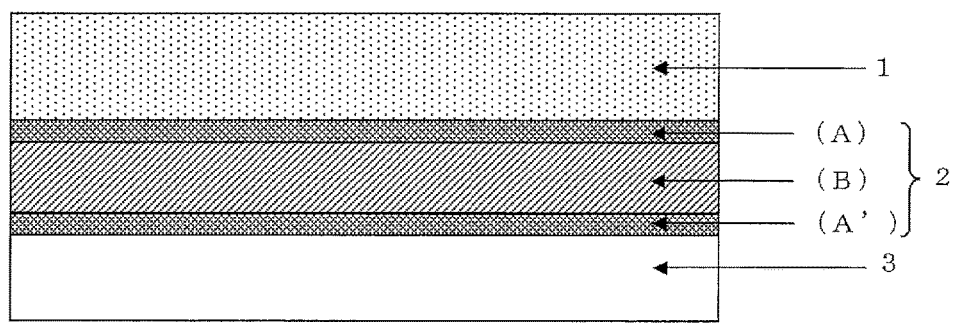

WAFER PROCESSING LAMINATE, TEMPORARY ADHESIVE MATERIAL FOR WAFER PROCESSING, AND METHOD FOR MANUFACTURING THIN WAFER

TECHNICAL FIELD

The present invention relates to a wafer processing laminate, a temporary adhesive material for a wafer processing, and a method for manufacturing a thin wafer which enable a thin wafer to be obtained effectively.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required. In the step of grinding the back surface of a silicon substrate, a protective tape for the back surface is conventionally attached to a back side of the surface to be ground to prevent the wafer from breaking during grinding. However, this tape uses an organic resin film as its base, which has flexibility, but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass or the like, through an adhesive layer to sufficiently withstand the steps of grinding the back surface and forming a TSV and an electrode on the back surface. In this system, the adhesive layer used for bonding the substrate and the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred to as a "temporary adhesive layer" (or temporary adhesive material layer) herein.

With respect to the conventionally known temporary adhesive layer and a method for removing this layer, the following techniques have been proposed: an adhesive material containing a light-absorbing substance is irradiated with high intensity light to decompose the adhesive material layer, whereby the adhesive material layer is removed from the support (Patent Literature 1); a heat fusible hydrocarbon compound is used for the adhesive material, and bonding and removal are carried out in a heat-molten state (Patent Literature 2). The former technique has problems of requiring expensive tools such as laser, and a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

Besides, it has been proposed to use a silicone adhesive for the temporary adhesive material layer (Patent Literature 3). In this technique, a substrate is bonded to a support with an addition-curable silicone adhesive, and on the removal, the assembly is immersed in a chemical solution capable of dissolving or decomposing the silicone resin to separate the substrate from the support. Thus, this method takes a very long time for separation and is difficultly applied to the actual producing process.

In view of these problems, there has been proposed a technique using a thermoplastic organopolysiloxane temporary adhesive layer and a thermosetting siloxane-modified polymer temporary adhesive layer (Patent Literature 4). This technique has thermal process resistance to some extent, allows formation of a layer with uniform film thickness on a heavily stepped substrate, is highly compatible with the steps of forming a TSV and forming a wiring on the wafer back surface, and allows easy separation. However, this technique has a problem of heat resistance at high temperature exceeding 300° C.

CITATION LIST

Patent Literature

PATENT LITERATURE 1: Japanese Patent Laid-Open Publication No. 2004-64040
PATENT LITERATURE 2: Japanese Patent Laid-Open Publication No. 2006-328104
PATENT LITERATURE 3: U.S. Pat. No. 7,541,264
PATENT LITERATURE 4: Japanese Patent Laid-Open Publication No. 2013-48215

SUMMARY OF INVENTION

Technical Problem

The present invention was accomplished in view of the above-described problems, and has an object to provide a wafer processing laminate, a temporary adhesive material for a wafer processing, and a method for manufacturing a thin wafer using the same which facilitate temporary adhesion, allow formation of a layer with uniform film thickness on a heavily stepped substrate, are highly compatible with steps of forming a TSV and forming a wiring on the wafer back surface, have excellent resistance to a thermal process for wafer such as chemical vapor deposition (CVD) and laser annealing, especially have resistance to a thermal process at a high temperature exceeding 300° C., allow easy separation even if a thin wafer is diced before separation, and can increase productivity of thin wafers.

Solution to Problem

To accomplish the object, the present invention provides a wafer processing laminate comprising a support, a temporary adhesive material layer formed on the support, and a wafer stacked on the temporary adhesive material layer, the wafer having a front surface on which a circuit is formed and a back surface to be processed, wherein the temporary adhesive material layer comprises a three-layered complex temporary adhesive material layer that includes a first temporary adhesive layer composed of a thermoplastic organopolysiloxane polymer layer (A) having a thickness of less than 100 nm and releasably laminated to the front surface of the wafer, a second temporary adhesive layer composed of a thermosetting siloxane-modified polymer layer (B) releasably laminated to the first temporary adhesive layer, and a third temporary adhesive layer composed of a thermoplastic organopolysiloxane polymer layer (A') having a thickness of less than 100 nm, releasably laminated to the second temporary adhesive layer, and releasably laminated to the support.

Such a wafer processing laminate allows the layer to be formed with uniform film thickness on a heavily stepped substrate, is highly compatible with steps of forming a TSV and forming a wiring on the back surface of the wafer, and has excellent resistance to a thermal process. In particular, forming the first temporary adhesive layer composed of the thermoplastic organopolysiloxane polymer layer (A) with a thickness of less than 100 nm, forming the third temporary adhesive layer composed of the thermoplastic organopolysiloxane polymer layer (A') with a thickness of less than 100 nm, and interposing the second temporary adhesive layer between both the thin films enables excellent resistance to a thermal process at a high temperature exceeding 300° C., specifically, up to a temperature of the temporary adhesive material of about 400° C. This allows an increase in productivity of thin wafers.

Furthermore, the present invention provides a temporary adhesive material for a wafer processing, the temporary adhesive material being used for temporarily bonding a support and a wafer having a front surface on which a circuit is formed and a back surface to be processed, comprising a three-layered complex temporary adhesive material layer that includes a first temporary adhesive layer composed of a thermoplastic organopolysiloxane polymer layer (A) having a thickness of less than 100 nm and capable of releasably being laminated to the front surface of the wafer, a second temporary adhesive layer composed of a thermosetting siloxane-modified polymer layer (B) releasably laminated to the first temporary adhesive layer, and a third temporary adhesive layer composed of a thermoplastic organopolysiloxane polymer layer (A') having a thickness of less than 100 nm, releasably laminated to the second temporary adhesive layer, and capable of releasably being laminated to the support.

Such a temporary adhesive material for a wafer processing facilitates temporary adhesion between the wafer and the support, allows the layer to be formed with uniform film thickness on a heavily stepped substrate, is highly compatible with steps of forming a TSV and forming a wiring on the back surface of the wafer, and has excellent resistance to a thermal process. In particular, forming the first temporary adhesive layer composed of the thermoplastic organopolysiloxane polymer layer (A) with a thickness of less than 100 nm, forming the third temporary adhesive layer composed of the thermoplastic organopolysiloxane polymer layer (A') with a thickness of less than 100 nm, and interposing the second temporary adhesive layer between both the thin films enables excellent resistance to a thermal process at a high temperature exceeding 300° C. This allows an increase in productivity of thin wafers.

In these cases, a first peeling force is preferably larger than a second peeling force, where the first peeling force is required for peeling the thermosetting siloxane-modified polymer layer (B) from the thermoplastic organopolysiloxane polymer layer (A) when the polymer layer (B) laminated to the polymer layer (A) on the front surface of the wafer is thermally cured, and the second peeling force is required for peeling the polymer layer (B) from the thermoplastic organopolysiloxane polymer layer (A') when the polymer layer (B) laminated to the polymer layer (A') on the support is thermally cured.

The layers having such peeling force enable the support to be separated with the polymer layer (B) remaining on the wafer side.

The thermoplastic organopolysiloxane polymer layer (A) and/or (A') is preferably a layer of an unreactive organopolysiloxane containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$, and $R^{16}$ each represent an unsubstituted or substituted monovalent hydrocarbon group, the unreactive organopolysiloxane having a weight average molecular weight of 200,000 to 1,000,000, and containing 0.5 mass % or less of a low molecular weight component having a molecular weight of 740 or less.

Moreover, the thermoplastic organopolysiloxane polymer layer (A) and/or (A') is preferably an unreactive organopolysiloxane layer composed of a partially dehydrated condensate of an organopolysiloxane shown by the following general formula (1) and an organopolysiloxane resin containing an $R^{21}R^{22}R^{23}SiO_{1/2}$ unit, where $R^{21}$, $R^{22}$ and $R^{23}$ each represent a hydroxyl group or an unsubstituted or substituted monovalent hydrocarbon group having 1 to 10 carbon atoms, and an $SiO_{4/2}$ unit with an $R^{21}R^{22}R^{23}SiO_{1/2}$ unit/$SiO_{4/2}$ unit mole ratio ranging from 0.6 to 1.7, the partially dehydrated condensate having a ratio of the organopolysiloxane to the organopolysiloxane resin of 99:1 to 50:50 and a weight average molecular weight of 400,000 to 1,500,000 and containing 0.5 mass % or less of a low molecular weight component having a molecular weight of 740 or less,

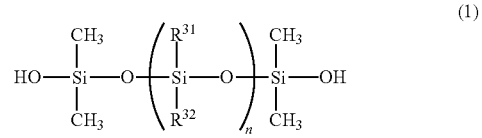

wherein $R^{31}$ and $R^{32}$ each represent an unsubstituted or substituted monovalent hydrocarbon group having 1 to 10 carbon atoms, and "n" represents 5,000 to 10,000.

Such thermoplastic organopolysiloxane polymer layers (A) and (A') are excellent in adhesiveness and heat resistance and thus preferable.

The thermoplastic organopolysiloxane polymer layer (A) and/or (A') preferably has a thickness of 1 to 80 nm.

The layers having such thickness exhibit better resistance to a thermal process at a high temperature exceeding 300° C.

The thermosetting siloxane-modified polymer layer (B) is preferably a cured layer of a composition containing 100 parts by mass of a siloxane bond-containing polymer having a repeating unit shown by the following general formula (2) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

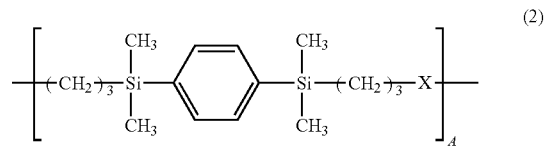

-continued

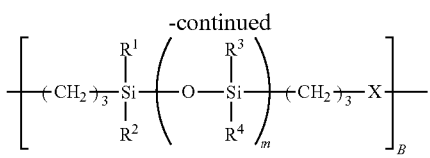

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and X represents a divalent organic group shown by the following general formula (3), (3)

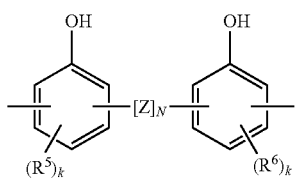

wherein Z represents a divalent organic group selected from any of

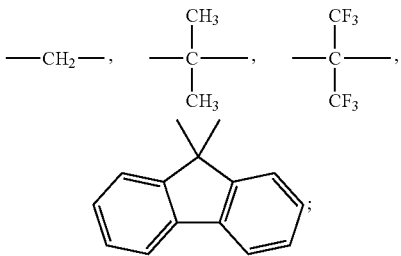

N represents 0 or 1; $R^5$ and $R^6$ each represent an alkyl or alkoxy group having 1 to 4 carbon atoms and may be the same or different from each other; and "k" represents 0, 1, or 2.

Moreover, the thermosetting siloxane-modified polymer layer (B) is preferably a cured layer of a composition containing 100 parts by mass of a siloxane bond-containing polymer having a repeating unit shown by the following general formula (4) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule, (4)

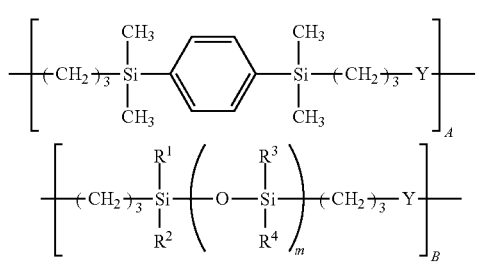

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and Y represents a divalent organic group shown by the following general formula (5), (5)

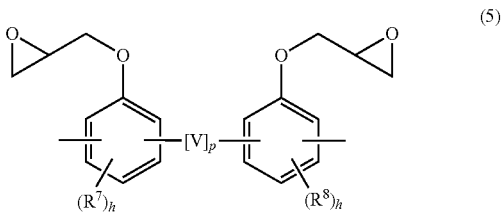

wherein V represents a divalent organic group selected from any of

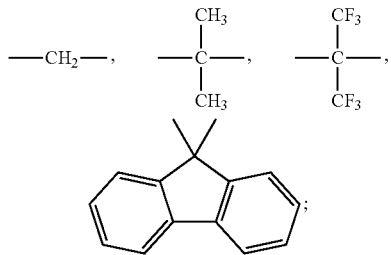

"p" represents 0 or 1; $R^7$ and $R^8$ each represent an alkyl or alkoxy group having 1 to 4 carbon atoms and may be the same or different from each other; and "h" represents 0, 1, or 2.

Such a thermosetting siloxane-modified polymer layer (B) is more excellent in heat resistance, and thus preferable.

The first peeling force is preferably 1 gf or more and 500 gf or less, and the second peeling force is preferably 0.5 gf or more and 50 gf or less, as measured by 180° peeling using a test piece having a width of 25 mm, where the first peeling force is required for peeling the thermosetting siloxane-modified polymer layer (B) from the thermoplastic organopolysiloxane polymer layer (A) when the polymer layer (B) laminated to the polymer layer (A) on the front surface of the wafer is thermally cured, and the second peeling force is required for peeling the polymer layer (B) from the thermoplastic organopolysiloxane polymer layer (A') when the polymer layer (B) laminated to the polymer layer (A') on the support is thermally cured.

The thermoplastic organopolysiloxane polymer layers (A) and (A') exhibiting such peeling force prevent the wafer from slipping at the time of grinding the wafer, facilitate separation, and thus are preferable.

In the inventive wafer processing laminate, the thermoplastic organopolysiloxane polymer layer (A) may be formed on a partial surface of the wafer and releasably adheres to the wafer.

Additionally, in the inventive wafer processing laminate, the thermoplastic organopolysiloxane polymer layer (A') may be formed on a partial surface of the support and releasably adheres to the support.

In the inventive temporary adhesive material for a wafer processing, a peripheral portion of the thermoplastic organopolysiloxane polymer layer (A) and/or (A') may be partially removed.

The polymer layers (A) and (A') having such shape allow a part of the polymer layer (B) to be directly laminated to the wafer having a circuit-forming front surface and a back surface to be processed (a circuit wafer) and a part of the polymer layer (B) to be directly laminated to the support, reducing a risk that separation occurs at the time of processing the circuit wafer.

Furthermore, the present invention provides a method for manufacturing a thin wafer comprising the steps of:
(a) bonding a support and a circuit-forming front surface of a wafer that has the circuit-forming front surface and a non-circuit-forming back surface through a complex temporary adhesive material layer used for the inventive wafer processing laminate, the complex temporary adhesive material layer including the thermoplastic organopolysiloxane polymer layer (A), the thermosetting siloxane-modified polymer layer (B), and the thermoplastic organopolysiloxane polymer layer (A'), wherein the bonding is performed under vacuum (reduced pressure) by bonding the support to which the polymer layer (A') and the polymer layer (B) are laminated in this order and the wafer to which the polymer layer (A) is laminated;
(b) heat curing the polymer layer (B);
(c) grinding or polishing the non-circuit-forming back surface of the wafer bonded to the support;
(d) processing the non-circuit-forming back surface of the wafer;
(e) separating the support and the polymer layer (A') laminated to the support together from the processed wafer; and
(f) separating the polymer layer (B) from the wafer after the step (e).

Such a method for manufacturing a thin wafer uses the three-layered temporary adhesive material layer in the present invention to bond the wafer and the support. Use of this temporary adhesive material layer allows easy production of a thin wafer having a through electrode structure or a bump connection structure. Moreover, the separating steps allow the support to be easily separated from the processed wafer. Furthermore, bonding the support, to which the polymer layers (A') and (B) have been laminated, and the circuit wafer, to which the polymer layer (A) has been laminated under vacuum allows the polymer layer (B) to be formed by, for example, a spin coating method and bonded regardless of the surface condition of the circuit wafer.

Furthermore, the present invention provides a method for manufacturing a thin wafer comprising the steps of:
(a) bonding a support and a circuit-forming front surface of a wafer that has the circuit-forming front surface and a non-circuit-forming back surface through a complex temporary adhesive material layer used for the inventive wafer processing laminate, the complex temporary adhesive material layer including the thermoplastic organopolysiloxane polymer layer (A), the thermosetting siloxane-modified polymer layer (B), and the thermoplastic organopolysiloxane polymer layer (A'), wherein the bonding is performed under vacuum (reduced pressure) by bonding the support to which the polymer layer (A') is laminated and the wafer to the circuit-forming front surface of which the polymer layer (A) and the polymer layer (B) are laminated in this order;
(b) heat curing the polymer layer (B);
(c) grinding or polishing the non-circuit-forming back surface of the wafer bonded to the support;
(d) processing the non-circuit-forming back surface of the wafer;
(e) separating the support and the polymer layer (A') laminated to the support together from the processed wafer; and
(f) separating the polymer layer (B) from the wafer after the step (e).

Such a method for manufacturing a thin wafer uses the three-layered temporary adhesive material layer in the present invention to bond the wafer and the support. Use of this temporary adhesive material layer allows easy production of a thin wafer having a through electrode structure or a bump connection structure. Moreover, the separating steps allow the support to be easily separated from the processed wafer. Furthermore, bonding the circuit wafer, to which the polymer layers (A) and (B) have been laminated, and the support, to which the polymer layer (A') has been laminated under vacuum allows the polymer layer (B) to be formed by the spin coating method without causing a residue of the polymer layer (B) on the side surface of the support, thus preventing the residue from peeling off in a subsequent step.

Advantageous Effects of Invention

The temporary adhesive material layer in the present invention has a three-layered structure. This three-layered structure particularly uses the thermosetting siloxane-modified resin (polymer layer (B)) as an intermediate layer of a supporting layer for bonding the substrate. This resin does not thermally decompose, does not flow at high temperature, and has excellent heat resistance. The temporary adhesive material layer is thus applicable to a wide range of the semiconductor film-forming process, and can form an adhesive material layer with high film-thickness uniformity even on a stepped wafer. This film-thickness uniformity enables a uniform thin wafer 50 µm or less thick to be easily obtained. Furthermore, forming both the thermoplastic organopolysiloxane resins (polymer layers (A) and (A')) with thicknesses of less than 100 nm enables the product to have good heat resistance to a thermal process at a high temperature exceeding 300° C., and improves process selectivity in production of thin wafers, thus increasing productivity.

BRIEF DESCRIPTION OF DRAWINGS

FIG. 1 is a cross-sectional view of an exemplary wafer processing laminate of the present invention.

DESCRIPTION OF EMBODIMENTS

Hereinafter, the present invention will be described in detail.

As mentioned above, it has been desired to develop a wafer processing laminate and a temporary adhesive material for a wafer processing which facilitate temporary adhesion, allow formation of the layer with uniform film thickness on a heavily stepped substrate, are highly compatible with the steps of forming a TSV and forming a wiring on the back surface of the wafer, have excellent resistance to a wafer thermal process especially at high temperature exceeding 300° C., and can increase productivity of thin wafers.

The present inventors earnestly studied to accomplish the above object and consequently found a method that can easily manufacture a thin wafer having a through electrode structure or a bump interconnect structure by using a temporary adhesive material layer that has a three-layer system including:
(A) a thermoplastic temporary adhesive layer composed of a thermoplastic organopolysiloxane polymer layer having a thickness of less than 100 nm;

(B) a thermosetting temporary adhesive layer composed of a thermosetting siloxane-modified polymer layer; and
(A') a thermoplastic temporary adhesive layer composed of a thermoplastic organopolysiloxane polymer layer having a thickness of less than 100 nm,
in which the layers are formed in the order of (A), (B), and (A') from the wafer side to bond the wafer and the support.

FIG. 1 is a cross-sectional view of an exemplary wafer processing laminate of the present invention. As shown in FIG. 1, the wafer processing laminate of the present invention has a wafer 1 having a front surface on which a circuit is formed and a back surface to be processed, a support 3 for supporting the wafer 1 during processing the wafer 1, and a temporary adhesive material layer 2 placed between the wafer 1 and the support 3. The temporary adhesive material layer 2 has a three-layered structure including a thermoplastic organopolysiloxane polymer layer (A) (first temporary adhesive layer) having a thickness of less than 100 nm, a thermosetting siloxane-modified polymer layer (B) (second temporary adhesive layer), and a thermoplastic organopolysiloxane polymer layer (A') (third temporary adhesive layer) having a thickness of less than 100 nm. The first temporary adhesive layer is releasably laminated to the front surface of the wafer 1, and the third temporary adhesive layer is releasably laminated to the support 3.

The temporary adhesive material for a wafer processing of the present invention is composed of a laminated material of the polymer layers (A), (B), and (A'), in which the layers are releasably laminated.

Hereinafter, the present invention will be described in more detail, but the present invention is not limited thereto.
[Temporary Adhesive Layer]
—First Temporary Adhesive Layer (A) and Third Temporary Adhesive Layer (A')/Thermoplastic Organopolysiloxane Polymer Layers—

The first temporary adhesive layer and the third temporary adhesive material layer are composed of a thermoplastic organopolysiloxane polymer. In the present invention, the polymer layers (A) and (A') may be the same or different.

The thermoplastic organopolysiloxane polymer used in the first temporary adhesive layer and the third temporary adhesive layer may be, for example, an unreactive organopolysiloxane containing 99.000 to 99.999 mol %, preferably 99.500 to 99.999 mol % of a siloxane unit (D unit) represented by $R^{11}R^{12}SiO_{2/2}$, 1.000 to 0.001 mol %, preferably 0.500 to 0.001 mol % of a siloxane unit (M unit) represented by $R^{13}R^{14}R^{15}SiO_{1/2}$, and 0.000 to 0.500 mol %, preferably 0.000 to 0.100 mol % of a siloxane unit (T unit) represented by $R^{16}SiO_{3/2}$. The unreactive organopolysiloxane has a weight average molecular weight of 200,000 to 1,000,000, preferably 400,000 to 900,000 and contains 0.5 mass % or less of a low molecular weight component having a molecular weight of 740 or less.

In the above formulae, the organic substituents $R^{11}$, $R^{12}$, $R^{13}$, $R^{14}$, $R^{15}$, and $R^{16}$ each represent an unsubstituted or substituted monovalent hydrocarbon group, preferably an unsubstituted or substituted monovalent hydrocarbon group having 1 to 10 carbon atoms. Illustrative examples thereof include hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; and groups in which a part or all of hydrogen atoms of the above groups is/are substituted by a halogen atom(s). Among them, a methyl group and a phenyl group are preferable.

The molecular weight of the organopolysiloxane is expressed by a weight average molecular weight obtained in accordance with a calibration curve prepared with a polystyrene standard substance by gel permeation chromatography (GPC) (Herein, "weight average molecular weight" means this value.). The weight average molecular weight is 200,000 or more, preferably 350,000 or more and 1,000,000 or less, more preferably 800,000 or less. The content of the low molecular weight component having a molecular weight of 740 or less is 0.5 mass % or less, more preferably 0.1 mass % or less.

The organopolysiloxane having a weight average molecular weight of 200,000 or more can sufficiently withstand the grinding step for thinning the wafer, thus it is preferable. The organopolysiloxane having a weight average molecular weight of 1,000,000 or less can be cleaned in a cleaning step after completion of the process, thus it is preferable. On the other hand, when the content of the low molecular weight component having a molecular weight of 740 or less is 0.5 mass % or less, sufficient heat resistance can be obtained to withstand a heat treatment for forming through electrodes or bump electrodes on the wafer back surface. Thus, this range is preferable.

Furthermore, D unit preferably constitutes 99.000 to 99.999 mol % of the resin. When this content is 99.000 mol % or more, the resin can withstand the grinding step for thinning the wafer, thus it is preferable. When the content is 99.999 mol % or less, the resin can be easily separated from the polymer layer (B) after completion of the step.

M unit is added to cap the active group at the ends of the resin mainly consisting of D unit, and used for adjusting the molecular weight thereof.

As another example, the thermoplastic organopolysiloxane polymer used in the first temporary adhesive layer and the third temporary adhesive layer may be an unreactive organopolysiloxane (thermoplastic resin-modified organopolysiloxane polymer) obtained by a partially dehydration condensation of an organopolysiloxane shown by the following general formula (1) and an organopolysiloxane resin containing an $R^{21}R^{22}R^{23}SiO_{1/2}$ unit, where $R^{21}$, $R^{22}$ and $R^{23}$ each represent a hydroxyl group or an unsubstituted or substituted monovalent hydrocarbon group having 1 to 10 carbon atoms, and an $SiO_{4/2}$ unit with an $R^{21}R^{22}R^{23}SiO_{1/2}$ unit/$SiO_{4/2}$ unit mole ratio ranging from 0.6 to 1.7. This partially dehydrated condensate has a ratio (mass ratio) of the organopolysiloxane to the organopolysiloxane resin of 99:1 to 50:50 and a weight average molecular weight of 400,000 to 1,500,000 and contains 0.5 mass % or less of a low molecular weight component having a molecular weight of 740 or less.

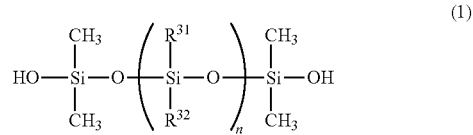

(1)

wherein $R^{31}$ and $R^{32}$ each represent an unsubstituted or substituted monovalent hydrocarbon group having 1 to 10 carbon atoms, and "n" represents 5,000 to 10,000.

The layer containing the above partial condensate, which serves as a release layer, can adjust peeling force of the wafer and the support. Since the organopolysiloxane shown by the general formula (1) has a polymerization degree of 5,000 to 10,000, the polymer layers (A) and (A') containing the partial condensate can be regarded as thermoplastic resin-modified organopolysiloxane polymer layers with high polymerization degree.

In the above formula, $R^{31}$ and $R^{32}$ represent an unsubstituted or substituted monovalent hydrocarbon group having 1 to 10 carbon atoms. Illustrative examples thereof include monovalent hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; and groups in which a part or all of hydrogen atoms of the above groups is/are substituted by a halogen atom(s). Among them, a methyl group and a phenyl group are preferable.

$R^{21}$, $R^{22}$ and $R^{23}$ represent a hydroxyl group or an unsubstituted or substituted monovalent hydrocarbon group having 1 to 10 carbon atoms. Illustrative examples thereof include monovalent hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; groups in which a part or all of hydrogen atoms of the above groups is/are substituted by a halogen atom(s); and a hydroxyl group. Among them, a methyl group is preferable.

The organopolysiloxane resin containing an $R^{21}R^{22}R^{23}SiO_{1/2}$ unit (M unit) and an $SiO_{4/2}$ unit (Q unit) (hereinafter, also referred to as MQ resin) may contain a hydroxyl group bonded to a silicon atom. In this case, the content of the hydroxyl group is about 0 to 4.0 mass %, preferably 0.5 to 1.5 mass %, with respect to 100 g of the MQ resin. The MQ resin may further contain a relative low amount of an $R^{24}SiO_{3/2}$ unit (T unit) and an $R^{25}R^{26}SiO_{2/2}$ unit (D unit), where $R^{24}$, $R^{25}$, and $R^{26}$ represent a hydroxyl group or an unsubstituted or substituted monovalent hydrocarbon group having 1 to 10 carbon atoms. Illustrative examples thereof are the same as $R^{21}$, $R^{22}$, and $R^{23}$ describe above.

Examples of an organic solvent used in the dehydration condensation reaction include pentane, hexane, cyclopentane, cyclohexane, methylcyclohexane, octane, isooctane, decane, undecane, isododecane, limonene, pinene, and toluene; toluene is preferable. Examples of an amine catalyst used in the dehydration condensation reaction include ammonia water, triethylamine, and pyridine; ammonia water is preferable. The reaction time for the dehydration condensation reaction is 12 to 100 hours, preferably 18 to 36 hours.

The organopolysiloxane obtained by the reaction may be dissolved in a solvent such as toluene, 5 to 20 parts by mass of hexamethyldisilazane may be added to 100 parts by mass of the organopolysiloxane, and the solution may be refluxed for 3 to 5 hours to change remaining hydroxyl groups into trimethylsiloxy groups. Furthermore, the obtained resin-modified organopolysiloxane may be dissolved in a rich solvent such as hexane and mixed with a poor solvent such as acetone in an amount of 1.5 to 3 times the total weight of the solution to use a resin-modified organopolysiloxane precipitated in the lower layer.

The weight average molecular weight of the obtained resin-modified organopolysiloxane is 400,000 or more, preferably 550,000 or more, and 1,500,000 or less, preferably 1,200,000 or less.

The resin-modified organopolysiloxane having a weight average molecular weight of 400,000 or more can sufficiently withstand the grinding step for thinning the wafer, thus it is preferable. The resin-modified organopolysiloxane having a weight average molecular weight of 1,500,000 or less can be cleaned in a cleaning step after completion of the process, thus it is preferable. On the other hand, when the content of the low molecular weight component having a molecular weight of 740 or less is 0.5 mass % or less, sufficient heat resistance can be obtained to withstand a heat treatment for forming through electrodes or bump electrodes on the wafer back surface. Thus, this range is preferable.

Furthermore, D unit preferably constitutes 95.000 to 99.999 mol % of the resin. When this content is 95.000 mol % or more, the resin can withstand the grinding step for thinning the wafer, thus it is preferable. When the content is 99.999 mol % or less, the resin can be easily separated from the temporary adhesive layer (B) after completion of the step.

The organopolysiloxane and the organopolysiloxane resin used for the reaction each may be one kind or a combination of two or more kinds. The resin-modified organopolysiloxane to be obtained may be one kind or two or more kinds.

The thermoplastic organopolysiloxane polymer layer may be formed on the wafer by applying its solution by a method such as spin coating and roll coater. When the polymer layer (A) is formed on the wafer, or the polymer layer (A') is formed on the support by spin coating, it is preferable to apply a solution of each resin. In this case, a hydrocarbon solvent, such as pentane, hexane, cyclohexane, isononane, decane, isododecane, limonene, and p-menthane, are preferably used.

The thicknesses of the polymer layers (A) and (A') in the wafer processing laminate and the temporary adhesive material for a wafer processing of the present invention are less than 100 nm. The thicknesses of the polymer layers (A) and (A') are preferably 1 to 80 nm, more preferably 2 to 60 nm, much more preferably 3 to 50 nm. In particular, the polymer layers (A) and (A') each having a thickness of 1 to 80 nm facilitate separation between the wafer and the support. The polymer layer (A) or (A') each having a thickness of 100 nm or more cannot withstand a thermal process at a high temperature exceeding 300° C. Consequently, appearance abnormalities such as voids, swelling of the wafer, and breakage of the wafer occur in the laminated wafer.

The thermoplastic organopolysiloxane polymer layer (A) typically has a peeling force, which is required for peeling the polymer layer (B) from the polymer layer (A) when the polymer layer (B) laminated to the polymer layer (A) on the front surface of the circuit wafer is thermally cured, of 1 gf or more and 500 gf or less, preferably 3 gf or more and 300 gf or less, more preferably 5 gf or more and 250 gf or less, as measured by 180° peeling using a test piece having a width of 25 mm. When this peeling force is 1 gf or more, the wafer is prevented from slipping at the time of grinding the wafer. When this peeling force is 500 gf or less, the polymer layer (B) can be easily peeled off. Thus, this range is preferable.

The thermoplastic organopolysiloxane polymer layer (A') typically has a peeling force, which is required for peeling the polymer layer (B) from the polymer layer (A') when the polymer layer (B) laminated to the polymer layer (A') on the support is thermally cured, of 0.5 gf or more and 50 gf or less, preferably 1 gf or more and 40 gf or less, more preferably 3 gf or more and 30 gf or less, as measured by 180° peeling using a test piece having a width of 25 mm. When this peeling force is 0.5 gf or more, separation is prevented from occurring during processing the wafer. When this peeling force is 50 gf or less, the wafer can be easily separated. Thus, this range is preferable.

The first peeling force is preferably larger than the second peeling force, where the first peeling force is required for peeling the polymer layer (B) from the polymer layer (A) when the polymer layer (B) laminated to the polymer layer (A) on the front surface of the circuit wafer is thermally cured, and the second peeling force is required for peeling the polymer layer (B) from the polymer layer (A') when the polymer layer (B) laminated to the polymer layer (A') on the support is thermally cured, for this enables the support to be separated with the polymer layer (B) remaining on the wafer side.

The peeling force required for peeling the polymer layer (B) after thermally curing from the polymer layer (A) and the peeling force required for peeling the polymer layer (B) after thermally curing from the polymer layer (A') are determined by structures and thicknesses of the polymer layers (A) and (A') and surface conditions of the wafer and the support. Generally, a flatter and smoother surface has lower adhesion, while an uneven surface has higher adhesion. The support surface is typically flat with less evenness, while the circuit wafer surface is uneven. This surface variation causes difference in adhesion even if the polymer layers (A) and (A') have the same structure and thickness. Thus, when the surface conditions of the support and the wafer considerably affect the adhesion difference, the same material may be used for the polymer layers (A) and (A'); when the surface conditions hardly affect the adhesion difference, the structures and thicknesses of the polymer layers (A) and (A') are preferably changed to make the adhesion difference.

In the inventive wafer processing laminate, the polymer layer (A) may be formed on a partial surface of the circuit wafer and releasably adheres to the wafer. The polymer layer (A') may be likewise formed on a partial surface of the support and releasably adheres to the support. That is, a peripheral portion of the polymer layer (A) and/or (A') in the inventive temporary adhesive material for a wafer processing may be partially removed. This allows a part of the polymer layer (B) to be directly laminated to the circuit wafer and a part of the polymer layer (B) to be directly laminated to the support, reducing a risk that separation occurs at the time of processing the circuit wafer.

—Second Temporary Adhesive Layer (B)/Thermosetting Siloxane-Modified Polymer Layer—

The thermosetting siloxane-modified polymer layer (B), which is a constitutional element of the wafer processing laminate and the temporary adhesive material for a wafer processing of the present invention, is not particularly limited so long as it is a thermosetting siloxane-modified polymer layer. The polymer layer (B) is preferably a cured layer of the thermosetting composition mainly consisting of the thermosetting siloxane-modified polymer shown by the following general formula (2) or (4). The polymer layer (B) may be a combination of the polymers shown by the general formulae (2) and (4). In this case, the (polymerization) ratio of (2):(4) is preferably from 0.1:99.9 to 99.9:0.1, more preferably from 1:99 to 99:1.

Polymer of Formula (2) (Phenolic Siloxane Polymer):

A polymer of the general formula (2) is a siloxane bond-containing polymer (phenol group-containing organosiloxane bond-containing polymer compound). This polymer has a repeating unit shown by the general formula (2) and a weight average molecular weight of 3,000 to 500,000, preferably 10,000 to 100,000,

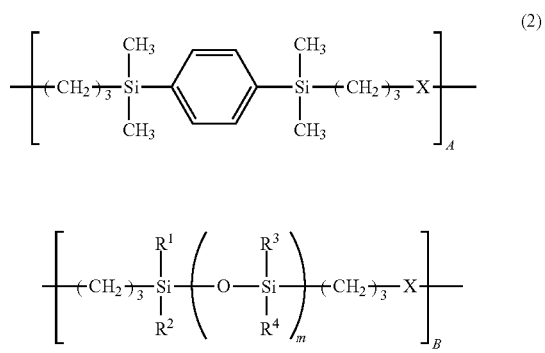

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and X represents a divalent organic group shown by the following general formula (3),

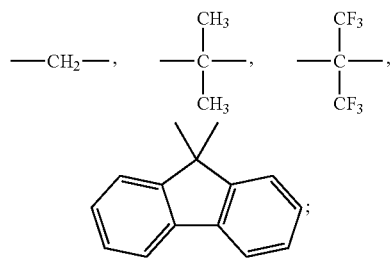

wherein Z represents a divalent organic group selected from any of

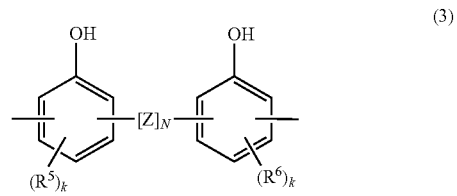

N represents 0 or 1; $R^5$ and $R^6$ each represent an alkyl or alkoxy group having 1 to 4 carbon atoms and may be the same or different from each other; and "k" represents 0, 1, or 2.

In this case, illustrative examples of $R^1$ to $R^4$ include alkyl groups such as a methyl group and an ethyl group; and a phenyl group. "m" represents an integer of preferably 3 to 60, more preferably 8 to 40. B/A ranges from 0 to 20, particularly from 0.5 to 5.

Polymer of Formula (4) (Epoxy-Modified Siloxane Polymer):

A polymer of the general formula (4) is a siloxane bond-containing polymer (epoxy group-containing silicone polymer compound). This polymer has a repeating unit shown by the general formula (4) and a weight average molecular weight of 3,000 to 500,000,

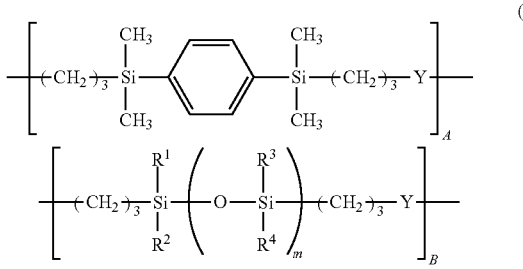

(4)

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and Y represents a divalent organic group shown by the following general formula (5),

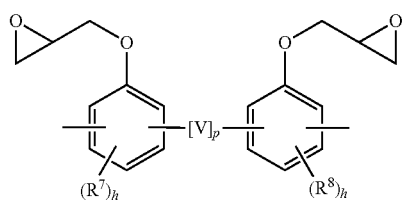

(5)

wherein V represents a divalent organic group selected from any of

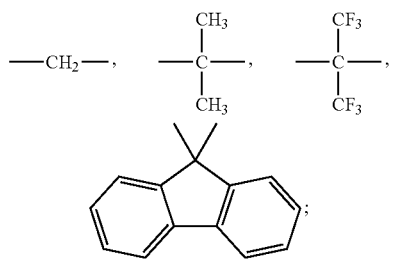

"p" represents 0 or 1; $R^7$ and $R^8$ each represent an alkyl or alkoxy group having 1 to 4 carbon atoms and may be the same or different from each other; and "h" represents 0, 1, or 2.

In this case, illustrative examples of $R^1$ to $R^4$ and "m" are the same as in the general formula (2).

The thermosetting composition mainly consisting of the thermosetting siloxane-modified polymer of the general formula (2) and/or (4) contains one or more crosslinkers for heat curing. In the case of the phenolic siloxane polymer of the general formula (2), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, the amino condensate, the melamine resin, the urea resin each modified with formalin or formalin-alcohol may be exemplified by the following. For example, the melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in combination of two or more kinds.

The urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in combination of two or more kinds.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in combination of two or more kinds.

On the other hand, in the case of the epoxy-modified siloxane polymer of the general formula (4), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formulae (2) and (4) is not particularly limited. In particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a crosslinker shown by the following formula may be contained.

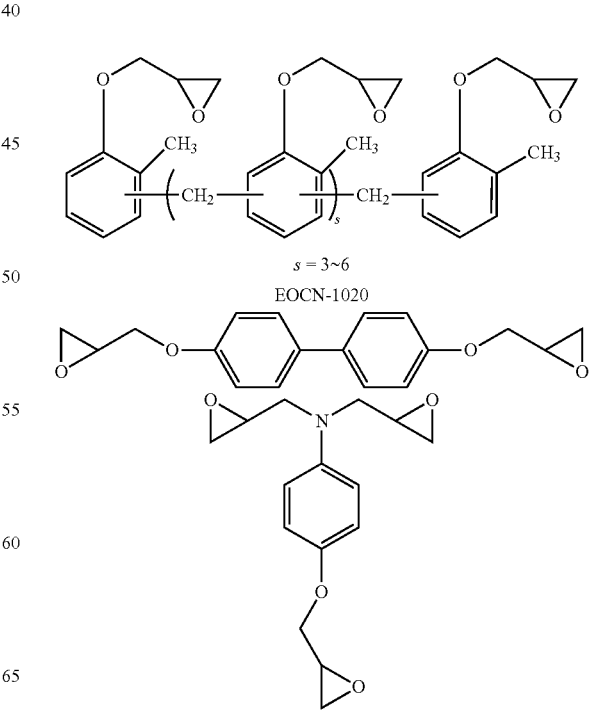

-continued

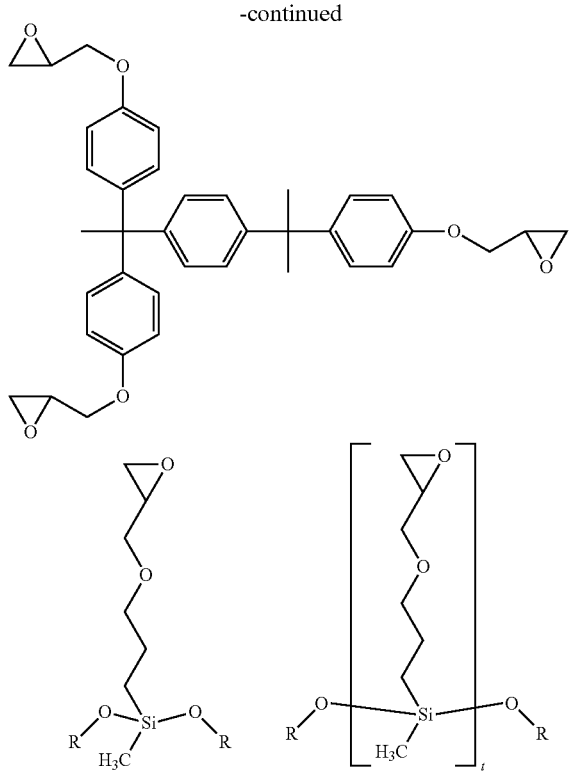

R = methyl group or ethyl group    R = methyl group or ethyl group t = 1  20%
t = 2  75%
t ≥ 3  5%

In the case that the thermosetting siloxane-modified polymer is the epoxy-modified siloxane polymer of the general formula (4), examples of its crosslinker include m- or p-cresol-novolac resins such as EP-6030G available from Asahi Organic Chemicals Industry Co., Ltd., tri-functional phenol compounds such as Tris-P-PA4 available from Honshu Chemical Industry Co., Ltd., and tetra-functional phenol compounds such as TEP-TPA available from Asahi Organic Chemicals Industry Co., Ltd., etc.

The formulation amount of the crosslinker is 0.1 to 50 parts by mass, preferably 0.1 to 30 parts by mass, more preferably 1 to 20 parts by mass based on 100 parts by mass of the thermosetting siloxane-modified polymer. Two, three or more crosslinkers may be blended in combination.

A curing catalyst such as an acid anhydride may be added in an amount of 10 parts by mass or less based on 100 parts by mass of the thermosetting siloxane-modified polymer.

The composition containing the thermosetting siloxane-modified polymer or the like may be dissolved in a solvent and applied by a method such as spin coating, roll coater, or die coater on the polymer layer (A) or (A'). In this case, illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in combination of two or more kinds.

In addition, a known antioxidant and a filler such as silica may be added in an amount of 50 parts by mass or less based on 100 parts by mass of the thermosetting siloxane-modified polymer to improve heat resistance. Moreover, a surfactant may be added to improve coating uniformity.

Illustrative examples of the antioxidant that can be added into the polymer layer (B) include hindered phenol compounds such as tetrakis[methylene-(3,5-di-tert-butyl-4-hydroxyhydrocinnamate)]methane (product name: Adekastab AO-60).

The thermosetting siloxane-modified polymer layer (B) in the wafer processing laminate and the temporary adhesive material for a wafer processing of the present invention is preferably formed with a film thickness of 15 to 150 μm, more preferably 20 to 120 μm, according to unevenness at the wafer side. When the film thickness is 15 μm or more, it can sufficiently withstand the grinding step for thinning the wafer. When the film thickness is 150 μm or less, the resin is prevented from deforming in the heat treatment process such as TSV formation process, and can be put to practical use. Thus, this range is preferable.

—Optional Component—

Optional components, besides the above-mentioned components, may be added to the temporary adhesive material for a wafer processing of the present invention. Usable example thereof include unreactive organopolysiloxanes such as polydimethyl siloxane and polydimethyldiphenyl siloxane; antioxidants of phenol type, quinone type, amine type, phosphorus type, phosphite type, sulfur type, thioether type, or other type; photo stabilizers of triazole type, benzophenone type, or other type; flame retardants of phosphoric acid ester type, halogen type, phosphorus type, antimony type, or other type; antistatic agents such as a cationic activator, an anionic activator, and a nonionic activator; and solvents for reducing the viscosity during coating, which include aromatic solvents such as toluene and xylene, aliphatic solvents such as hexane, octane, and isoparaffin, ketone solvents such as methyl ethyl ketone and methyl isobutyl ketone, ester solvents such as ethyl acetate and isobutyl acetate, ether solvents such as diisopropyl ether and 1,4-dioxane, and a mixed solvent thereof.

[Method for Manufacturing Thin Wafer]

The inventive method for manufacturing a thin wafer is characterized by using the complex temporary adhesive material layer composed of three layers including the thermoplastic organopolysiloxane polymer layer (A) having a thickness of less than 100 nm, the thermosetting siloxane-modified polymer layer (B), and the thermoplastic organopolysiloxane polymer layer (A') having a thickness of less than 100 nm as the layer for bonding the support and the wafer having a semiconductor circuit or the like. The thickness of a thin wafer obtained by the inventive manufacturing method is typically 5 to 300 μm, more typically 10 to 100 μm.

The inventive method for manufacturing a thin wafer has the steps (a) to (f) and, if necessary, optional steps (g) to (j).

[Step (a)]

Step (a) is a step of bonding a support and a circuit-forming front surface of a wafer (a circuit wafer) that has the circuit-forming front surface and a non-circuit-forming back surface through the complex temporary adhesive material layer, which includes the thermoplastic organopolysiloxane polymer layer (A), the thermosetting siloxane-modified polymer layer (B), and the thermoplastic organopolysiloxane polymer layer (A'), used for the inventive wafer processing laminate. In this step, the bonding may be performed under vacuum by bonding the support to which the polymer layer (A') and the polymer layer (B) are laminated in this order and the circuit wafer to which the polymer layer (A) is laminated. Alternatively, the bonding may be performed under vacuum by bonding the support to which the polymer layer (A') is laminated and the circuit wafer to the circuit-forming front surface of which the polymer layer (A) and the polymer layer (B) are laminated in this order.

In the three-layered temporary adhesive material layer, peripheral portions of the first temporary adhesive material layer and the third temporary adhesive material layer composed of the thermoplastic organopolysiloxane polymer layers may be partially removed by a solvent that can dissolve the layer to form a part of the adhesive layer on the substrate and the support. When the adhesive material layer is partially removed, both the first temporary adhesive material layer and the third temporary adhesive material layer may be selected, or either the first temporary adhesive material layer or the third temporary adhesive material layer may be selected.

The wafer that has a circuit-forming surface and a non-circuit-forming surface is a wafer one surface of which is a circuit-forming surface, and the other surface of which is a non-circuit-forming surface. The wafer to which the present invention can be applied is typically a semiconductor wafer. Examples of the semiconductor wafer include not only a silicon wafer, but also a germanium wafer, a gallium-arsenic wafer, a gallium-phosphorus wafer, and a gallium-arsenic-aluminum wafer. The thickness of the wafer is typically, but not particularly limited to, 600 to 800 μm, more typically 625 to 775 μm.

As the support, a substrate such as a silicon wafer, a glass plate, and a quartz wafer can be used without any limitation. In the present invention, it is not necessary to irradiate an energy beam to the temporary adhesive material layer through the support, so that the support does not require light transmittance.

The polymer layer (B) may be formed as a film on the wafer or the support. Also, the polymer layers (A), (B), and (A') may be formed by applying the respective solutions to the wafer or the support by spin coating or other method. In this case, after spin coating, the layers are pre-baked at 80 to 200° C. depending on the volatile conditions of the used solvent, and then used.

The wafer and the support on which the polymer layers (A), (B), and (A') have been formed are bonded such that the polymer layer (B) is interposed between the polymer layers (A) and (A') to form a bonded substrate. The substrate is uniformly compressed under reduced pressure preferably at 40 to 200° C., more preferably 60 to 180° C. to form a wafer processing laminate (laminated substrate) in which the wafer and the support are bonded. As described above, the polymer layers (A) and (A') in the wafer processing laminate each have a thickness of less than 100 nm.

Examples of a wafer-bonding apparatus include a commercially available wafer-bonding apparatus such as EVG520IS and 850 TB manufactured by EV Group, and XBC300 manufactured by SUSS MicroTec AG.

[Step (b)]

Step (b) is a step of heat curing the polymer layer (B). After the wafer processing laminate (laminated substrate) is formed, the wafer processing laminate is heated at 120 to 220° C., preferably 150 to 200° C., for 10 minutes to 4 hours, preferably 30 minutes to 2 hours, to cure the polymer layer (B).

[Step (c)]

Step (c) is a step of grinding or polishing the non-circuit-forming back surface of the wafer bonded to the support, i.e., a step of grinding or polishing the wafer processing laminate obtained by bonding in the step (a) from the wafer back surface side to reduce the thickness of the wafer. The technique for grinding the wafer back surface is not particularly limited, and known grinding techniques may be used. The grinding is preferably performed while water is fed to the wafer and a grinding wheel (e.g. diamond) for cooling. Examples of an apparatus for grinding the wafer back surface include DAG-810 (product name) manufactured by DISCO Co., Ltd. The wafer back surface side may be subjected to CMP polishing.

[Step (d)]

Step (d) is a step of processing the non-circuit-forming back surface of the wafer that has been ground, i.e., the non-circuit-forming surface of the wafer that has been thinned by grinding the back surface. This step includes various processes applied in the wafer level. Examples thereof include wafer surface treatment, electrode formation, metal wiring formation, and protective film formation. More specifically, there may be mentioned well-known processes including CVD for wafer surface treatment, laser annealing, metal sputtering for forming electrodes or the like, vapor deposition, wet etching for etching a sputtered metal layer, patterning process in which a resist is applied and subjected to exposure and development to form a pattern used as a mask for metal wiring formation, resist removal, dry etching, plating with metal, formation of an organic film for protecting the surface, silicon etching for forming a TSV, and formation of an oxide film on silicon surface. In these processes, the wafer processing laminate preferably has a wide range of resistance to high temperature, up to about 400° C. In particular, the wafer processing laminate preferably exhibits strength and lifetime even at 300° C. or higher.

[Step (e)]

Step (e) is a step of separating the support and the polymer layer (A') laminated to the support together from the wafer processed in the step (d), i.e., a step of separating the support and the polymer layer (A') from the wafer processing laminate after the thinned wafer is subjected to various processes. This separating step is generally carried out under relatively low temperature condition from room temperature to about 60° C. This step may be performed by a mechanically separating method in which one of the wafer and the support of the wafer processing laminate is horizontally fixed, and the other is lifted at a certain angle with respect to the horizontal direction; or a peeling method in which a protective film is bonded to the ground surface of the wafer, and then the wafer and the protective film are separated from the wafer processing laminate.

Both the separating methods can be applied to the present invention, although it is not limited to these methods. These separating methods are usually carried out at room temperature.

The step (e) of separating the support and the polymer layer (A') from the processed wafer preferably includes the steps of:

(g) bonding a dicing tape to the processed surface (back surface) of the processed wafer;

(h) attaching the dicing tape surface by vacuum suction to a suction surface; and (i) separating the support and the polymer layer (A') from the processed wafer by peeling-off at a temperature of the suction surface in the range of 10° C. to 100° C. These steps enable the support and the polymer layer (A') to be easily separated from the processed wafer, and facilitate a subsequent dicing step. The dicing tape may be a known tape using, for example, a polyester or polyethylene film.

[Step (f)]

Step (f) is a step of separating the polymer layer (B) from the processed wafer by, for example, tape peeling, after the support and the polymer layer (A') are removed in the step (e).

This separating step is typically carried out under relatively low temperature condition from room temperature to about 60° C. In the step (f), the polymer layer (B) can be separated from the processed wafer, for example, by horizontally fixing the wafer after the step (e), bonding a tape for peeling to the uncovered polymer layer (B), and peeling the tape.

The tape may be any tape capable of peeling. In particular, a tape using silicone adhesive material is preferable. For example, polyester film adhesive tapes No. 646S and No. 648, made of Teraoka Seisakusho Co., Ltd., are preferably used.

After the step (f), it is preferable to remove the temporary adhesive material layer remaining on the circuit-forming surface of the separated wafer, as step (j). The temporary adhesive layer (A) may partially remain on the circuit-forming surface of the wafer that has been separated by the step (f). In this case, the temporary adhesive layer (A) can be removed by, for example, cleaning the wafer.

In the step (j), any cleaning solution capable of dissolving the thermoplastic organopolysiloxane polymer layer constituting the layer (A) in the temporary adhesive material layer can be used. Illustrative examples thereof include pentane, hexane, cyclohexane, decane, isononane, p-menthane, pinene, isododecane, and limonene. These solvents may be used alone or in combination of two or more kinds thereof. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass % in terms of concentration in the cleaning solution. To improve removal efficiency of the residual matters, an existing surfactant may be added thereto. Cleaning may be performed by paddling, spraying, or dipping in a cleaner tank with the above solution. The temperature in this operation is preferably 10 to 80° C., more preferably 15 to 65° C. If necessary, after dissolving the layer (A) in the dissolving solution, the wafer may be finally rinsed with water or an alcohol and then dried to obtain a thin wafer.

EXAMPLES

In the following, the present invention will be specifically described with reference to examples and comparative examples, but the present invention is not limited to these examples.

Resin Synthesis Example 1

A four-necked flask was charged with 1,000 g (3.38 mol) of octamethylcyclotetrasiloxane and 0.24 g (0.0015 mol) of hexamethyldisiloxane, and the mixture was maintained at 110° C. Then, 4 g of 10 mass % tetrabutylphosphonium hydroxide siliconate was added to the mixture. After polymerization over 4 hours, a post-treatment was carried out at 160° C. for 2 hours to obtain dimethylpolysiloxane.

The dimethylpolysiloxane was analyzed by $^{29}$Si-NMR method to determine the ratio of D unit and M unit, and consequently identified as a dimethylpolysiloxane having the following structure containing 99.978% of D unit and 0.022% of M unit with a polymerization degree of about 9,000.

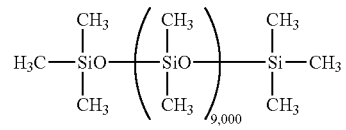

500 g of the dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer (a1) having a weight average molecular weight of 700,000 and containing 0.05 mass % of a low molecular weight component having a molecular weight of 740 or less.

Resin Synthesis Example 2

A four-necked flask was charged with 1,000 g (3.38 mol) of octamethylcyclotetrasiloxane and 0.93 g (0.003 mol) of tris(trimethylsiloxy)methylsilane, and the mixture was maintained at 110° C. Then, 4 g of 10 mass % tetrabutyl phosphonium hydroxide siliconate was added to the mixture. After polymerization over 4 hours, a post-treatment was carried out at 160° C. for 2 hours to obtain dimethylpolysiloxane.

The obtained dimethylpolysiloxane was analyzed by $^{29}$Si-NMR method to determine the ratio of D unit, M unit, and T unit, and consequently identified as a branched dimethylpolysiloxane having the following structure containing 99.911% of D unit, 0.067% of M unit, and 0.022% of T unit.

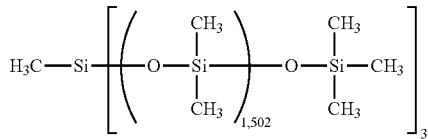

500 g of the branched dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer (a2) having a weight average molecular weight of 400,000 and containing 0.07 mass % of a low molecular weight component having a molecular weight of 740 or less.

Resin Synthesis Example 3

In a four-necked flask, 80 parts of a crude rubber state dimethylpolysiloxane (corresponding to the general formula (1), where "n" is 9,000) both molecular terminals of which are sealed with hydroxyl groups and a 30% toluene solution of which has a viscosity at 25° C. of 98,000 mPa·s, and 20 parts of methylpolysiloxane resin composed of 0.75 mol of $(CH_3)_3SiO_{1/2}$ unit and 1 mol of $SiO_{4/2}$ unit and containing 1.0 mol % of hydroxyl group per 100 parts of the solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under reduced pressure, and toluene, condensed water, ammonia, etc., were removed therefrom to obtain a solidified partially condensate. 900 parts of toluene was added to 100 parts of the partially condensate to dissolve the condensate. To the solution was added 20 parts of hexamethyldisilazane, and the mixture was stirred at 130° C. for 3 hours to seal the remaining hydroxyl groups. Subsequently, the mixture was heated to 180° C. under reduced pressure, and the solvent was removed to obtain a solidified non-reactive partially condensate. Moreover, after adding 900 parts of hexane to 100 parts of the non-reactive partially condensate to dissolve the condensate, this solution was added to 2000 parts of acetone, and the precipitated resin was collected. Thereafter, hexane, etc., were removed under vacuum to obtain a dimethylpolysiloxane polymer (a3) having a weight average molecular weight of 950,000 and containing 0.05 mass % of a low molecular weight component having a molecular weight of 740 or less.

Resin Synthesis Example 4

In a four-necked flask, 90 parts of a crude rubber state dimethylpolysiloxane (corresponding to the general formula (1), where "n" is 9,000) both molecular terminals of which are sealed with hydroxyl groups and a 30% toluene solution of which has a viscosity at 25° C. of 98,000 mPa·s, and 10 parts of methylpolysiloxane resin composed of 0.75 mol of $(CH_3)_3SiO_{1/2}$ unit and 1 mol of $SiO_{4/2}$ unit and containing 1.0 mol % of hydroxyl group per 100 parts of the solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under reduced pressure, and toluene, condensed water, ammonia, etc., were removed therefrom to obtain a solidified partially condensate. 900 parts of toluene was added to 100 parts of the partially condensate to dissolve the condensate. To the solution was added 20 parts of hexamethyldisilazane, and the mixture was stirred at 130° C. for 3 hours to seal the remaining hydroxyl groups. Subsequently, the mixture was heated to 180° C. under reduced pressure, and the solvent was removed to obtain a solidified non-reactive partially condensate. Moreover, after adding 900 parts of hexane to 100 parts of the non-reactive partially condensate to dissolve the condensate, this solution was added to 2000 parts of acetone, and the precipitated resin was collected. Thereafter, hexane, etc., were removed under vacuum to obtain a dimethylpolysiloxane polymer (a4) having a weight average molecular weight of 900,000 and containing 0.05 mass % of a low molecular weight component having a molecular weight of 740 or less.

Resin Synthesis Example 5

In a four-necked flask, 95 parts of a crude rubber state dimethylpolysiloxane (corresponding to the general formula (1), where "n" is 9,000) both molecular terminals of which are sealed with hydroxyl groups and a 30% toluene solution of which has a viscosity at 25° C. of 98,000 mPa·s, and 5 parts of methylpolysiloxane resin composed of 0.75 mol of $(CH_3)_3SiO_{1/2}$ unit and 1 mol of $SiO_{4/2}$ unit and containing 1.0 mol % of hydroxyl group per 100 parts of the solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under reduced pressure, and toluene, condensed water, ammonia, etc., were removed therefrom to obtain a solidified partially condensate. 900 parts of toluene was added to 100 parts of the partially condensate to dissolve the condensate. To the solution was added 20 parts of hexamethyldisilazane, and the mixture was stirred at 130° C. for 3 hours to seal the remaining hydroxyl groups. Subsequently, the mixture was heated to 180° C. under reduced pressure, and the solvent was removed to obtain a solidified non-reactive partially condensate. Moreover, after adding 900 parts of hexane to 100 parts of the non-reactive partially condensate to dissolve the condensate, this solution was added to 2000 parts of acetone, and the precipitated resin was collected. Thereafter, hexane, etc., were removed under vacuum to obtain a dimethylpolysiloxane polymer (a5) having a weight average molecular weight of 800,000 and containing 0.05 mass % of a low molecular weight component having a molecular weight of 740 or less.

Resin Synthesis Example 6

A flask equipped with a stirrer, a thermometer, a nitrogen purge system, and a reflux condenser was charged with 43.1 g of 9,9'-bis(3-allyl-4-hydroxyphenyl)fluorene (M-1), 29.5 g of organohydrogensiloxane shown by the average structural formula (M-3), 135 g of toluene, and 0.04 g of chloroplatinic acid, and the mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution (b1) containing cyclohexanone as a solvent with a concentration of the resin solid of 50 mass %. When the molecular weight of the resin in the solution was measured by GPC, the weight average molecular weight was 45,000 in terms of polystyrene.

Resin Synthesis Example 7

In a 5-L flask equipped with a stirrer, a thermometer, a nitrogen purge system, and a reflux condenser, 84.1 g of epoxy compound (M-2) was dissolved in 600 g of toluene. Then, 294.6 g of compound (M-3) and 25.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution (b2) containing PGMEA as a solvent with a concentration of the solid component of 60 mass %. When the molecular weight of the resin in the resin solution was measured by GPC, the weight average molecular weight was 28,000 in terms of polystyrene.

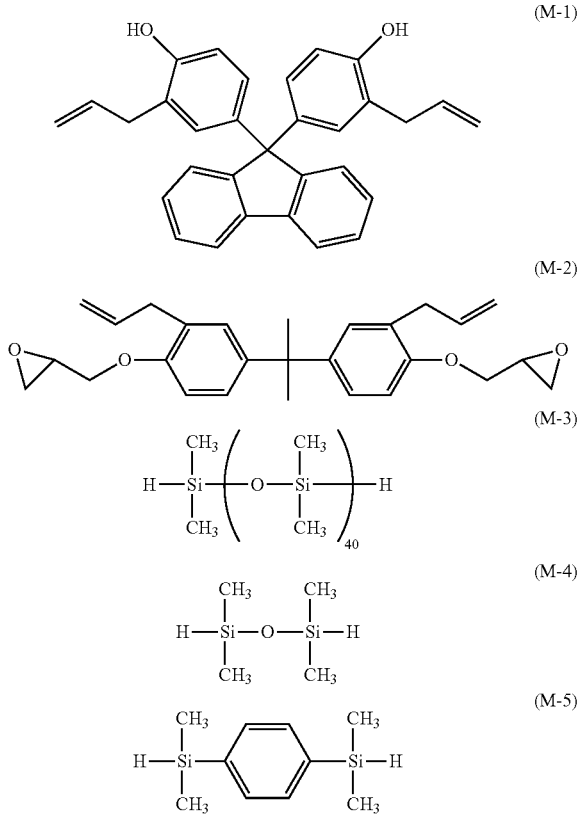

Solution Preparation Example 1

0.5 g of the polymer (a1) was dissolved in 100 g of isododecane, and the solution was filtered through a 0.2-μm membrane filter to obtain an isododecane solution (A-1) of the dimethylpolysiloxane polymer.

Solution Preparation Example 2

0.3 g of the polymer (a2) was dissolved in 100 g of isododecane, and the solution was filtered through a 0.2-μm membrane filter to obtain an isododecane solution (A-2) of the dimethylpolysiloxane polymer.

Solution Preparation Example 3

0.1 g of the polymer (a3) was dissolved in 100 g of isododecane, and the solution was filtered through a 0.2-μm membrane filter to obtain an isododecane solution (A-3) of the dimethylpolysiloxane polymer.

Solution Preparation Example 4

1.0 g of the polymer (a4) was dissolved in 100 g of isododecane, and the solution was filtered through a 0.2-μm membrane filter to obtain an isododecane solution (A-4) of the dimethylpolysiloxane polymer.

Solution Preparation Example 5

0.3 g of the polymer (a5) was dissolved in 100 g of isododecane, and the solution was filtered through a 0.2-μm membrane filter to obtain an isododecane solution (A-5) of the dimethylpolysiloxane polymer.

Solution Preparation Example 6

1.5 g of the polymer (a4) was dissolved in 100 g of isododecane, and the solution was filtered through a 0.2-μm membrane filter to obtain an isododecane solution (A-6) of the dimethylpolysiloxane polymer.

Solution Preparation Example 7

50 g of the resin solution (b1) was mixed with 7.5 g of an epoxy crosslinker, EOCN-1020 available from NIPPON KAYAKU Co., Ltd., as a crosslinker, 0.2 g of BSDM (bis(tert-butylsulfonyl)diazomethane) available from Wako Pure Chemical Industries Ltd., as a curing catalyst, and 0.1 g of tetrakis[methylene-(3,5-di-tert-butyl-4-hydroxyhydrocinnamate)]methane (product name: Adekastab AO-60) as an antioxidant. The solution was then filtered through a 0.2-μm membrane filter to obtain a resin solution (B-1).

Solution Preparation Example 8

100 g of the resin solution (b2) was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 0.2-μm membrane filter to obtain a resin solution (B-2).

Comparative Preparation Example 1

2.5 g of the polymer (a1) was dissolved in 100 g of isododecane, and the solution was filtered through a 0.2-μm membrane filter to obtain an isododecane solution (A-7) of the dimethylpolysiloxane polymer.

Examples 1 to 7 and Comparative Examples 1 to 5

Onto a 200-mm diameter silicon wafer (thickness: 725 μm) whose entire surface was formed with copper posts having height of 10 μm and diameter of 40 μm, the resin solutions (A-1) to (A-7) were each applied by spin coating, and then heated with a hot plate at 180° C. for 5 minutes to form a layer corresponding to the layer (A) on the bump-formed surface of the wafer. Example 6 was subjected to an edge-cut treatment with isododecane after spin coating to remove the layer (A) at the wafer peripheral portion by a width shown in Table 1. On the other hand, the polymer solution corresponding to the layer (A') was applied to a 200-mm diameter glass plate (thickness: 500 μm), which was used as the support, by spin coating. The support was then heated with a hot plate at 180° C. for 5 minutes. On the layer (A') on the support was applied the polymer solution corresponding to the layer (B) by spin coating. The support was then heated with a hot plate at 150° C. for 3 minutes to semi-cure the layer (B). The silicon wafer and the glass plate thus obtained were bonded so that their resin surfaces faced each other in a vacuum bonding apparatus under the conditions shown in Table 1. A laminate was thereby manufactured (under the pressure bonding condition). Table 1 shows thicknesses of the layers (A), (B), and (A') in the laminate (wafer processing laminate). The thicknesses of the layers (A), (B), and (A') were determined by measuring thicknesses of respective films that were formed on a 200-mm bare Si wafer by spin coating under the same condition, with a spectrometric film-thickness measurement system (VM-1210 manufactured by Dainippon Screen Mfg. Co., Ltd.).

In the above examples, the glass plate was used as the support for the purpose of visually observing abnormalities after bonding the substrate, but a substrate such as a silicon wafer, which does not transmit visible light, can also be used.

Thereafter, the bonded substrate was subjected to the following tests. The results of examples and comparative examples are shown in Table 1. In addition, evaluations were carried out in order described below. When the result became anomaly (the judgment is "poor" or "moderate") during the tests, the evaluation thereafter was stopped, and showed with "–".

—Adhesion Test—

The 200-mm wafer was bonded with a wafer-bonding apparatus EVG520IS manufactured by EV group. The bonding was carried out at adhesion temperature shown in Table 1, under a chamber internal pressure during bonding of $10^{-3}$ mbar or less, with a load of 5 kN. After bonding, the substrate was once heated with an oven at 180° C. for 1 hour to cure the layer (B). The substrate was then cooled to room temperature, and adhesion state of its interface was observed by naked eye. When no abnormality like bubbles was found at the interface, the specimen was evaluated as good, and shown with "good". When an abnormality was found, the specimen was evaluated as poor, and shown with "poor".

—Back Surface Grinding Resistance Test—

The back surface of the silicon wafer was ground by a grinder (DAG810, manufactured by DISCO Co., Ltd.) with a diamond grinding wheel. After the wafer was ground to a final substrate thickness of 50 μm, abnormalities such as crack and separation were checked with an optical microscope (100-folds). When no abnormality was found, the specimen was evaluated as good, and shown with "good". When an abnormality was found, the specimen was evaluated as poor, and shown with "poor".

In Examples 3 and 6, after the back surface was ground, the wafer the back surface of which had been ground was diced with a dicer (manufactured by DISCO Co., Ltd.). The wafer was diced into chips with a size of 10 mm×10 mm such that the back-surface-ground wafer and the layer (A) were cut, the layer (B) was cut halfway, and the layer (A') and the support were not cut. The laminates subjected to the dicing process are shown with "Yes" in Table 1.

—Heat Resistance Test—

After the back surface of the silicon wafer had been ground, the laminate was placed in an oven under nitrogen atmosphere at 200° C. for 2 hours, followed by heating with a hot plate at 320° C. for 10 minutes. Then, abnormalities in appearance of the laminate were checked. When no appearance abnormality was found, the specimen was evaluated as good, and shown with "good". When appearance abnormality such as voids and swelling of the wafer occurred, the specimen was shown with "poor".

—Support Separation Test—

A dicing tape was bonded to the processed surface (non-circuit-forming surface) side of the wafer that had been thinned to 50 μm and subjected to the heat resistance test, with a dicing frame. This dicing tape surface was set to a suction plate by vacuum suction. Then, one point of the glass was lifted by tweezers at room temperature to separate the glass substrate. When the support could be separated without cracking the 50-μm wafer, the specimen was shown with "good". When an abnormality such as crack occurred, the specimen was evaluated as poor, and shown with "poor". In only Example 6, which was subjected to the edge-cut treatment, the test was carried out after the edge-cut portion was trimmed by a dicer.

—Tape Peeling Test—

The dicing tape surface of the wafer, which had been subjected to the support separation test and previous tests, was continuously set to the suction plate by vacuum suction. Then, a polyester film adhesive tape No. 648, made of Teraoka Seisakusho Co., Ltd., was bonded to the uncovered polymer layer (B) to separate the polymer layer (B) from the wafer by tape peeling. When the layer was separated without cracking the 50-μm wafer, the specimen was shown with "good". When an abnormality such as crack occurred, the specimen was evaluated poor, and shown with "poor". As regards Example 6, in which the peripheral portion was subjected to the edge-cut treatment, the specimen was evaluated as good when the portion where the edge-cut treatment had not been subjected was separated.

—Cleaning Removability Test—

After the tape peeling test, the 200-mm wafer (which had been exposed to the heat resistance test condition) mounted on the dicing frame via the dicing tape was set on a spin coater, with the adhesive layer upside. Isononane was then sprayed as a cleaning solution for 3 minutes, and the wafer was rinsed by spraying isopropyl alcohol (IPA) while rotating the wafer. Thereafter, appearance of the wafer was observed to check the presence of a residue of the adhesive material resin by naked eye. When no resin remained, the specimen was evaluated as good, and shown with "good". When the resin remained, the specimen was evaluated as poor, and shown with "poor".

—Peeling Force Test—

The polymer layer (A) was formed on the same silicon wafer formed with copper posts as used in the cleaning removability test and previous tests under the same conditions as in the above examples and comparative examples. The polymer layer (B) was formed thereon and cured. Thereafter, five polyimide tapes each having a length of 150 mm and a width of 25 mm were bonded thereto, and a part of the layer (B) to which no tape has been bonded was removed. 120 mm of the tapes were then peeled off from one end by 180° peeling with AUTOGRAPH (AG-1) manufactured by Shimadzu Co., and an average force applied at this time (120 mm stroke, 5 times) was measured as a peeling force of the layer (A).

In a similar manner, the polymer layer (A') was formed on a bare silicon wafer under the same conditions as in the above examples and comparative examples, and the polymer layer (B) was formed thereon and cured. Thereafter, five polyimide tapes each having a length of 150 mm and a width of 25 mm were bonded thereto, and a part of the layer (B) to which no tape has been bonded was removed. 120 mm of the tapes were then peeled off from one end by 180° peeling with AUTOGRAPH (AG-1) manufactured by Shimadzu Co., and an average force applied at this time (120 mm stroke, 5 times) was measured as a peeling force of the layer (A').

TABLE 1

|  |  | Example 1 | Example 2 | Example 3 | Example 4 | Example 5 | Example 6 | Example 7 |
|---|---|---|---|---|---|---|---|---|
| Manufacturing conditions | Polymer layer (A) | A-1 | A-2 | A-3 | A-4 | A-5 | A-5 | A-6 |
|  | Thickness of layer (A) | 25 nm | 15 nm | 6 nm | 45 nm | 15 nm | 15 nm | 80 nm |
|  | Edge-cut treatment of layer (A) | none | none | none | none | none | 3 mm | none |
|  | Peeling force of layer (A) | 5 gf | 10 gf | 200 gf | 10 gf | 50 gf | 50 gf | 6 gf |
|  | Polymer layer (B) | B-1 | B-2 | B-2 | B-1 | B-2 | B-2 | B-1 |
|  | Thickness of layer (B) | 50 μm | 50 μm | 70 μm | 40 μm | 50 μm | 50 μm | 40 μm |
|  | Polymer layer (A') | A-1 | A-1 | A-2 | A-4 | A-2 | A-1 | A-6 |
|  | Thickness of layer (A') | 25 nm | 25 nm | 15 nm | 45 nm | 15 nm | 25 nm | 80 nm |
|  | Edge-cut treatment of layer (A') | none | none | none | none | none | 3 mm | none |
|  | Peeling force of layer (A') | 2 gf | 2 gf | 3 gf | 3 gf | 3 gf | 2 gf | 2 gf |
|  | Adhesion temperature | 150° C. | 120° C. | 120° C. | 150° C. | 120° C. | 120° C. | 150° C. |
|  | Dicing process | none | none | yes | none | none | yes | none |
| Results | Adhesion | good | good | good | good | good | good | good |
|  | Back surface grinding resistance | good | good | good | good | good | good | good |
|  | Heat resistance | good | good | good | good | good | good | good |
|  | Support separation ability | good | good | good | good | good | good | good |
|  | Tape peeling performance | good | good | good | good | good | good | good |
|  | Cleaning removability | good | good | good | good | good | good | good |

|  |  | Comparative Example 1 | Comparative Example 2 | Comparative Example 3 | Comparative Example 4 | Comparative Example 5 |
|---|---|---|---|---|---|---|
| Manufacturing conditions | Polymer layer (A) | none | A-4 | A-3 | A-7 | A-5 |
|  | Thickness of layer (A) | — | 45 nm | 6 nm | 150 nm | 15 nm |
|  | Edge-cut treatment of layer (A) | — | none | none | none | none |
|  | Peeling force of layer (A) | — | 10 gf | 200 gf | 2 gf | 50 gf |
|  | Polymer layer (B) | B-2 | none | B-1 | B-1 | B-2 |
|  | Thickness of layer (B) | 50 μm | — | 50 μm | 50 μm | 50 μm |
|  | Polymer layer (A') | A-1 | A-1 | none | A-1 | A-7 |
|  | Thickness of layer (A') | 25 nm | 25 nm | — | 25 nm | 150 nm |
|  | Edge-cut treatment of layer (A') | none | none | — | none | none |
|  | Peeling force of layer (A') | 2 gf | 2 gf | — | 2 gf | 1 gf |
|  | Adhesion temperature | 120° C. | 150° C. | 150° C. | 150° C. | 120° C. |
|  | Dicing process | none | — | none | none | none |
| Results | Adhesion | good | poor | good | good | good |
|  | Back surface grinding resistance | good | — | good | good | good |

TABLE 1-continued

| | | | | | |
|---|---|---|---|---|---|
| Heat resistance | good | — | good | poor | poor |
| Support separation ability | good | — | poor | — | — |
| Tape peeling performance | poor | — | — | — | — |
| Cleaning removability | — | — | — | — | — |

Table 1 shows that Examples 1 to 7, which satisfy the requirements of the present invention, facilitated temporary adhesion and separation. In addition, Examples 3 and 6, which were subjected to dicing process prior to debonding, succeeded in separation without any problems. The problems such as voids and breakage of the wafer did not occur even when the thinned wafer was subjected to the heat resistance test at high temperature of 320° C. By contrast, Comparative example 1, in which the layer (A) was not applied unlike Example 2, failed to separate the layer (B) by tape peeling. Comparative example 2, in which the layer (B) was not applied, failed in adhesion. Comparative example 3, in which the layer (A') was not applied, failed to separate the support. This indicates all the three layers were required to accomplish the whole processes. Furthermore, Comparative example 4, in which the layer (A) was 150 nm, caused voids in the heat resistance test at 320° C. Comparative example 5, in which the layer (A') was 150 nm, also caused voids in the heat resistance test at 320° C. This indicates that when the layer (A) or (A') was formed with a thickness of 100 nm or more, an error occurs in a high temperature state exceeding 300° C.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A wafer processing laminate comprising a support, a temporary adhesive material layer formed on the support, and a wafer stacked on the temporary adhesive material layer, the wafer having a front surface on which a circuit is formed and a back surface to be processed, wherein
the temporary adhesive material layer comprises a three-layered complex temporary adhesive material layer that includes a first temporary adhesive layer composed of a thermoplastic organopolysiloxane polymer layer (A) having a thickness of less than 100 nm and releasably laminated to the front surface of the wafer, a second temporary adhesive layer composed of a thermosetting siloxane-modified polymer layer (B) releasably laminated to the first temporary adhesive layer, and a third temporary adhesive layer composed of a thermoplastic organopolysiloxane polymer layer (A') having a thickness of less than 100 nm, releasably laminated to the second temporary adhesive layer, and releasably laminated to the support, and
at least one of the thermoplastic organopolysiloxane polymer layer (A) and the thermoplastic organopolysiloxane polymer layer (A') has a thickness of 1 to 80 nm.

2. The wafer processing laminate according to claim 1, wherein a first peeling force is larger than a second peeling force, where the first peeling force is required for peeling the thermosetting siloxane-modified polymer layer (B) from the thermoplastic organopolysiloxane polymer layer (A) when the polymer layer (B) laminated to the polymer layer (A) on the front surface of the wafer is thermally cured, and the second peeling force is required for peeling the polymer layer (B) from the thermoplastic organopolysiloxane polymer layer (A') when the polymer layer (B) laminated to the polymer layer (A') on the support is thermally cured.

3. The wafer processing laminate according to claim 1, wherein at least one of the thermoplastic organopolysiloxane polymer layer (A) and the thermoplastic organopolysiloxane polymer layer (A') is a layer of a thermoplastic organopolysiloxane containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$ and, $R^{16}$ each represent an unsubstituted or substituted monovalent hydrocarbon group, the unreactive organopolysiloxane having a weight average molecular weight of 200,000 to 1,000,000, and containing 0.5 mass % or less of a low molecular weight component having a molecular weight of 740 or less.

4. The wafer processing laminate according to claim 1, wherein at least one of the thermoplastic organopolysiloxane polymer layer (A) and the thermoplastic organopolysiloxane polymer layer (A') is a thermoplastic organopolysiloxane layer composed of a partially dehydrated condensate of an organopolysiloxane shown by the following general formula (1) and an organopolysiloxane resin containing an $R^{21}R^{22}R^{23}SiO_{1/2}$ unit, where $R^{21}$, $R^{22}$ and $R^{23}$ each represent a hydroxyl group or an unsubstituted or substituted monovalent hydrocarbon group having 1 to 10 carbon atoms, and an $SiO_{4/2}$ unit with an $R^{21}R^{22}R^{23}SiO_{1/2}$ unit/$SiO_{4/2}$ unit mole ratio ranging from 0.6 to 1.7, the partially dehydrated condensate having a ratio of the organopolysiloxane to the organopolysiloxane resin of 99:1 to 50:50 and a weight average molecular weight of 400,000 to 1,500,000 and containing 0.5 mass % or less of a low molecular weight component having a molecular weight of 740 or less,

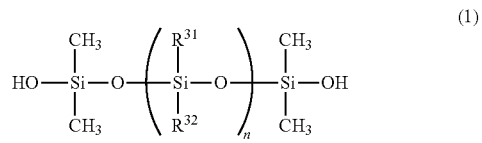

(1)

wherein $R^{31}$ and $R^{32}$ each represent an unsubstituted or substituted monovalent hydrocarbon group having 1 to 10 carbon atoms, and "n" represents 5,000 to 10,000.

5. The wafer processing laminate according to claim 1, wherein the thermosetting siloxane-modified polymer layer (B) is a cured layer of a composition containing 100 parts by mass of a siloxane bond-containing polymer having a repeating unit shown by the following general formula (2) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

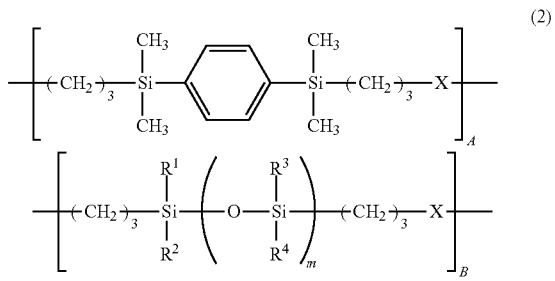
(2)

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and X represents a divalent organic group shown by the following general formula (3),

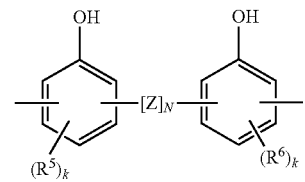
(3)

wherein Z represents a divalent organic group selected from any of

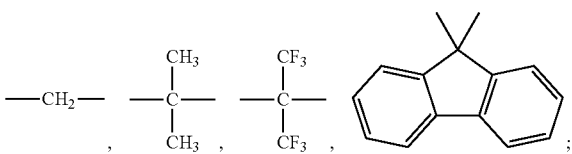

N represents 0 or 1; $R^5$ and $R^6$ each represent an alkyl or alkoxy group having 1 to 4 carbon atoms and may be the same or different from each other; and "k" represents 0, 1, or 2.

6. The wafer processing laminate according to claim 1, wherein the thermosetting siloxane-modified polymer layer (B) is a cured layer of a composition containing 100 parts by mass of a siloxane bond-containing polymer having a repeating unit shown by the following general formula (4) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

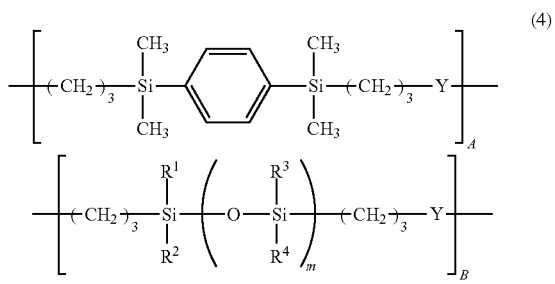
(4)

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and Y represents a divalent organic group shown by the following general formula (5),

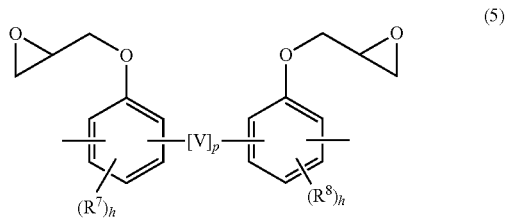
(5)

wherein V represents a divalent organic group selected from any of

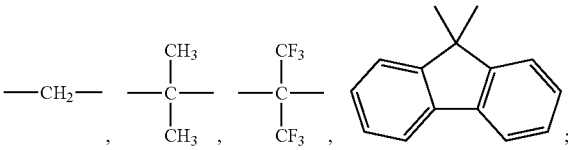

"p" represents 0 or 1; $R^7$ and $R^8$ each represent an alkyl or alkoxy group having 1 to 4 carbon atoms and may be the same or different from each other; and "h" represents 0, 1, or 2.

7. The wafer processing laminate according to claim 1, wherein the first peeling force is 1 gf or more and 500 gf or less, and the second peeling force is 0.5 gf or more and 50 gf or less, as measured by 180° peeling using a test piece having a width of 25 mm, where the first peeling force is required for peeling the thermosetting siloxane-modified polymer layer (B) from the thermoplastic organopolysiloxane polymer layer (A) when the polymer layer (B) laminated to the polymer layer (A) on the front surface of the wafer is thermally cured, and the second peeling force is required for peeling the polymer layer (B) from the thermoplastic organopolysiloxane polymer layer (A') when the polymer layer (B) laminated to the polymer layer (A') on the support is thermally cured.

8. The wafer processing laminate according to claim 1, wherein the thermoplastic organopolysiloxane polymer layer (A) is formed on a partial surface of the wafer and releasably adheres to the wafer.

9. The wafer processing laminate according to claim 1, wherein the thermoplastic organopolysiloxane polymer layer (A') is formed on a partial surface of the support and releasably adheres to the support.

10. A temporary adhesive material for a wafer processing, the temporary adhesive material being used for temporarily bonding a support and a wafer having a front surface on which a circuit is formed and a back surface to be processed, comprising
a three-layered complex temporary adhesive material layer that includes a first temporary adhesive layer composed of a thermoplastic organopolysiloxane polymer layer (A) having a thickness of less than 100 nm and capable of releasably being laminated to the front surface of the wafer, a second temporary adhesive layer composed of a thermosetting siloxane-modified polymer layer (B) releasably laminated to the first temporary adhesive layer, and a third temporary adhesive layer composed of a thermoplastic organopolysiloxane polymer layer (A') having a thickness of less than 100 nm, releasably laminated to the second temporary adhesive layer, and capable of releasably being laminated to the support,
wherein at least one of the thermoplastic organopolysiloxane polymer layer (A) and the thermoplastic organopolysiloxane polymer layer (A') has a thickness of 1 to 80 nm.

11. The temporary adhesive material for a wafer processing according to claim 10, wherein a first peeling force is larger than a second peeling force, where the first peeling force is required for peeling the thermosetting siloxane-modified polymer layer (B) from the thermoplastic organopolysiloxane polymer layer (A) when the polymer layer (B) laminated to the polymer layer (A) on the front surface of the wafer is thermally cured, and the second peeling force is required for peeling the polymer layer (B) from the thermoplastic organopolysiloxane polymer layer (A') when the polymer layer (B) laminated to the polymer layer (A') on the support is thermally cured.

12. The temporary adhesive material for a wafer processing according to claim 10, wherein at least one of the thermoplastic organopolysiloxane polymer layer (A) and the thermoplastic organopolysiloxane polymer layer (A') is a layer of a thermoplastic organopolysiloxane containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$ and $R^{16}$ each represent an unsubstituted or substituted monovalent hydrocarbon group, the unreactive organopolysiloxane having a weight average molecular weight of 200,000 to 1,000,000, and containing 0.5 mass % or less of a low molecular weight component having a molecular weight of 740 or less.

13. The temporary adhesive material for a wafer processing according to claim 10, wherein at least one of the thermoplastic organopolysiloxane polymer layer (A) and the thermoplastic organopolysiloxane polymer layer (A') is a thermoplastic organopolysiloxane layer composed of a partially dehydrated condensate of an organopolysiloxane shown by the following general formula (1) and an organopolysiloxane resin containing an $R^{21}R^{22}R^{23}SiO_{1/2}$ unit, where $R^{21}$, $R^{22}$ and $R^{23}$ each represent a hydroxyl group or an unsubstituted or substituted monovalent hydrocarbon group having 1 to 10 carbon atoms, and an $SiO_{4/2}$ unit with an $R^{21}R^{22}R^{23}SiO_{1/2}$ unit/$SiO_{4/2}$ unit mole ratio ranging from 0.6 to 1.7, the partially dehydrated condensate having a ratio of the organopolysiloxane to the organopolysiloxane resin of 99:1 to 50:50 and a weight average molecular weight of 400,000 to 1,500,000 and containing 0.5 mass % or less of a low molecular weight component having a molecular weight of 740 or less,

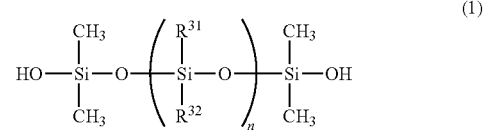

(1)

wherein $R^{31}$ and $R^{32}$ each represent an unsubstituted or substituted monovalent hydrocarbon group having 1 to 10 carbon atoms, and "n" represents 5,000 to 10,000.

14. The temporary adhesive material for a wafer processing according to claim 10, wherein the thermosetting siloxane-modified polymer layer (B) is a cured layer of a composition containing 100 parts by mass of a siloxane bond-containing polymer having a repeating unit shown by the following general formula (2) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

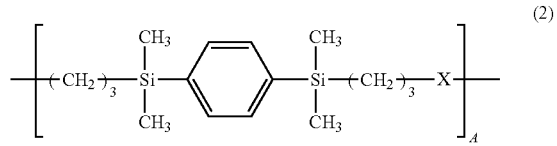

(2)

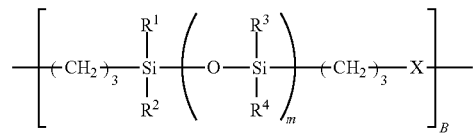

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and X represents a divalent organic group shown by the following general formula (3),

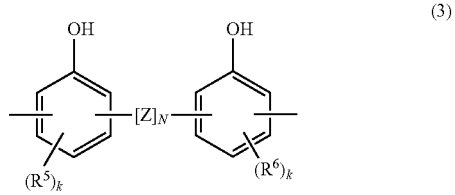

(3)

wherein Z represents a divalent organic group selected from any of

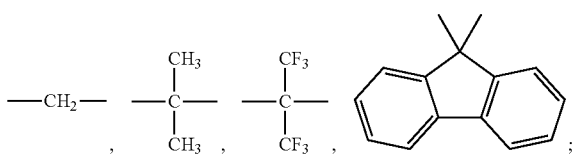

N represents 0 or 1; $R^5$ and $R^6$ each represent an alkyl or alkoxy group having 1 to 4 carbon atoms and may be the same or different from each other; and "k" represents 0, 1, or 2.

15. The temporary adhesive material for a wafer processing according to claim 10, wherein the thermosetting siloxane-modified polymer layer (B) is a cured layer of a composition containing 100 parts by mass of a siloxane bond-containing polymer having a repeating unit shown by the following general formula (4) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

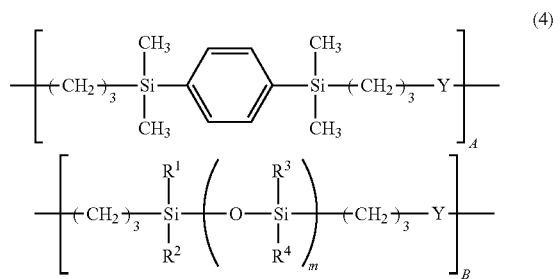

wherein $R^1$ to $R^4$ may be the same or different and represent a monovalent hydrocarbon group having 1 to 8 carbon atoms; "m" represents an integer of 1 to 100; B represents a positive number; A represents 0 or a positive number; and Y represents a divalent organic group shown by the following general formula (5),

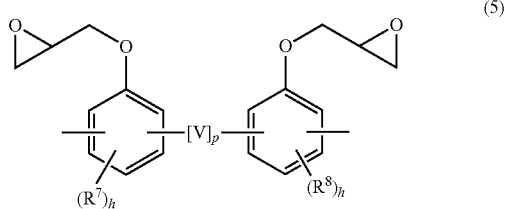

wherein V represents a divalent organic group selected from any of

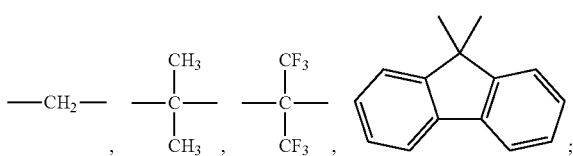

"p" represents 0 or 1; $R^7$ and $R^8$ each represent an alkyl or alkoxy group having 1 to 4 carbon atoms and may be the same or different from each other; and "h" represents 0, 1, or 2.

16. The temporary adhesive material for a wafer processing according to claim 10, wherein the first peeling force is 1 gf or more and 500 gf or less, and the second peeling force is 0.5 gf or more and 50 gf or less, as measured by 180° peeling using a test piece having a width of 25 mm, where the first peeling force is required for peeling the thermosetting siloxane-modified polymer layer (B) from the thermoplastic organopolysiloxane polymer layer (A) when the polymer layer (B) laminated to the polymer layer (A) on the front surface of the wafer is thermally cured, and the second peeling force is required for peeling the polymer layer (B) from the thermoplastic organopolysiloxane polymer layer (A') when the polymer layer (B) laminated to the polymer layer (A') on the support is thermally cured.

17. The temporary adhesive material for a wafer processing according to claim 10, wherein a peripheral portion of the thermoplastic organopolysiloxane polymer layer (A) and/or (A') is partially removed.

18. A method for manufacturing a thin wafer comprising the steps of:
(a) bonding a support and a circuit-forming front surface of a wafer that has the circuit-forming front surface and a non-circuit-forming back surface through a complex temporary adhesive material layer used for the wafer processing laminate according to claim 1, the complex temporary adhesive material layer including the thermoplastic organopolysiloxane polymer layer (A), the thermosetting siloxane-modified polymer layer (B), and the thermoplastic organopolysiloxane polymer layer (A'), wherein the bonding is performed under vacuum by bonding the support to which the polymer layer (A') and the polymer layer (B) are laminated in this order and the wafer to which the polymer layer (A) is laminated;
(b) heat curing the polymer layer (B);
(c) grinding or polishing the non-circuit-forming back surface of the wafer bonded to the support;
(d) processing the non-circuit-forming back surface of the wafer;
(e) separating the support and the polymer layer (A') laminated to the support together from the processed wafer; and
(f) separating the polymer layer (B) from the wafer after the step (e).

19. A method for manufacturing a thin wafer comprising the steps of:
(a) bonding a support and a circuit-forming front surface of a wafer that has the circuit-forming front surface and a non-circuit-forming back surface through a complex temporary adhesive material layer used for the wafer processing laminate according to claim 1, the complex temporary adhesive material layer including the thermoplastic organopolysiloxane polymer layer (A), the thermosetting siloxane-modified polymer layer (B), and the thermoplastic organopolysiloxane polymer layer (A'), wherein the bonding is performed under vacuum by bonding the support to which the polymer layer (A') is laminated and the wafer to the circuit-forming front surface of which the polymer layer (A) and the polymer layer (B) are laminated in this order;
(b) heat curing the polymer layer (B);
(c) grinding or polishing the non-circuit-forming back surface of the wafer bonded to the support;

(d) processing the non-circuit-forming back surface of the wafer;
(e) separating the support and the polymer layer (A') laminated to the support together from the processed wafer; and
(f) separating the polymer layer (B) from the wafer after the step (e).

* * * * *